United States Patent
Huang et al.

(10) Patent No.: US 6,337,888 B1
(45) Date of Patent: Jan. 8, 2002

(54) IN-PHASE AND QUADRATURE SIGNAL REGENERATION

(75) Inventors: Xinping Huang, Nepean; Mario Caron, Aylmer; Daniel J. Hindson, Dunrobin; Michel de Léséleuc, Alymer, all of (CA)

(73) Assignee: Her Majesty the Queen in right of Canada, as represented by the Minister of Industry, Ottawa (CA)

( * ) Notice: Subject to any disclaimer, the term of this patent is extended or adjusted under 35 U.S.C. 154(b) by 0 days.

(21) Appl. No.: 09/092,945

(22) Filed: Jun. 8, 1998

Related U.S. Application Data

(60) Provisional application No. 60/049,049, filed on Jun. 10, 1997.

(51) Int. Cl.$^7$ .................................................. H03D 3/08

(52) U.S. Cl. ........................ 375/322; 375/324; 455/324

(58) Field of Search ................................. 375/322, 324, 375/316, 331, 229, 235; 455/324, 314, 315

(56) References Cited

U.S. PATENT DOCUMENTS

| | | | |
|---|---|---|---|
| 5,095,536 A | 3/1992 | Loper | 455/324 |
| 5,263,196 A | 11/1993 | Jasper | 455/324 |
| 5,461,646 A | * 10/1995 | Anvari | 375/347 |
| 5,822,368 A | * 10/1998 | Wang | 375/229 |

FOREIGN PATENT DOCUMENTS

| | | | |
|---|---|---|---|
| EP | 0 805 561 A2 | 11/1994 | H04B/1/30 |
| EP | 0 692 895 A2 | 1/1996 | H04L/27/22 |

OTHER PUBLICATIONS

Ji Li, R.G. Bosisio, and Ke Wu, "A Six–Port Direct Digital Millimeter Wave Receiver," 1994 IEEE MTT–S Digest, Paper TH4A–1, pp. 1659–1662.

Ji Li, Renato G. Bosisio, and Ke Wu, "A Collision Avoidance Radar Using Six–Port Phase/Frequency Discriminator (SPFD)," 1994 IEEE National Telesystems Conference, Paper 3A–3, pp. 55–58.

(List continued on next page.)

*Primary Examiner*—Mohammad H. Ghayour
(74) *Attorney, Agent, or Firm*—Freedman & Associates

(57) ABSTRACT

The present invention relates to the regeneration of in-phase (I) and quadrature (Q) signals in electronic devices commonly used in communication, radar and instrumentation electronics. The original signal of interest comprises two orthogonal components that are mathematically modelled using complex values, which are then decomposed into a real (I) and an imaginary (Q) component. These two components are orthogonal to each other and represent fully the signal of interest. The present method adaptively compensates for the gain and phase imbalances and DC offsets in I and Q signal regeneration. First, 3 phase shifted versions of the received signal, either down-converted to some intermediate frequency (IF) or at baseband, are digitized. Although the optimum phase shift between each version is 360°/3, any phase shift different than 0° and 180° is acceptable and no a priori knowledge of the phase shifts is required. Based on these 3 digital signals representing 3 linear combinations of the I&Q signal components, the regeneration algorithm projects these signals into a 3-dimensional space composed of the I signal subspace, the Q signal subspace, and another subspace, referred to as the noise subspace. The projection is performed using an eigendecomposition method where the eigenvectors associated with the I and Q signal subspaces provide linear combination coefficients for regenerating the I&Q signals. Compensation for DC offsets is performed by removing an average DC offset on the phase and gain corrected I&Q signals. The regenerated digital I and Q signals are then converted back to analog signals, when required.

25 Claims, 5 Drawing Sheets

OTHER PUBLICATIONS

B. Huyart, M.-L. Comet, M. Cuhaci, D. Maurin, J.-J. Laurin, and R.G. Bosisio, "Adaptive Antenna System (AAS) using a Six–Port Module," ANTEM '94, Symposium on Antenna Technology and Applied Electromagnetics, 1994 Conference Proceedings, Ottawa, Canada, Aug. 3–5, 1994, pp. 63–66.

Ji Li, R.G. Bosisio, and Ke Wu, "Performing PSK Demodulation Using Six–Ports," ANTEM '94, Symposium on Antenna Technology and Applied Electromagnetics, 1994 Conference Proceedings, Ottawa, Canada, Aug. 3–5, 1994, pp. 15–18.

Ji Li, R.G. Bosisio, and Ke Wu, "A New Direct Digital Receiver Performing Coherent PSK Reception,", 1995 IEEE MTT–S Digest, paper TH1B–2, pp. 1007–1010.

Ji Li, R.G. Bosisio, and Ke Wu, "Modeling of the Six–Port Discriminator Used in a Microwave Direct Digital Receiver," 1995 Canadian Conference on Electrical and Computer Engineering, Sep. 5–8, 1995, Montreal, Canada, vol. II.

Ji Li, Renato G. Bosisio, and Ke Wu, "Computer and Measurement Simulation of a New Digital Receiver Operating Directly at Millimeter–Wave Frequencies," IEEE Transactions on Microwave Theory and Techniques, vol. 43, No. 12, Dec. 1995, pp. 2766–2772.

Ji Li, Renato G. Bosisio, and Ke Wu, "Dual–Tone Calibration of Six–Port Junction and Its Application to the Six–Port Direct Digital Millimetric Receiver," IEEE Transactions on Microwave Theory and Techniques, vol. 44, No. 1, Jan. 1996, pp. 93–99.

* cited by examiner

IN-PHASE AND QUADRATURE SIGNAL REGENERATION

This appln claims benefit of Prov. No. 60/049,049 filed Jun. 10, 1997.

FIELD OF THE INVENTION

The present invention relates to communication signal processing. More specifically, the present invention relates to the regeneration of the in-phase and quadrature signal components received by communication receivers for digitally modulated signals.

BACKGROUND OF THE INVENTION

In many communication, radar or instrumentation applications, a receiver generates two orthogonal signal components of the received signal to ease recovery of information contained within the received signal. Generally the two orthogonal baseband signals are generated from an incoming signal having a centre frequency (CF) by mixing the incoming signal with a reference signal tuned to approximately a same CF. The in-phase (I) signal results from mixing the incoming signal with the reference signal tuned to approximately a same CF and the quadrature (Q) signal results from mixing the incoming signal with a version of the reference signal phase shifted by 90°. After mixing the signals, a filter is used to remove undesired products of the mixing. Amplification is commonly used to adjust the I and Q signals to suitable levels for further processing.

In implementing circuitry to perform the mixing, filtering and amplification for each of the I and the Q signal paths, it is difficult to obtain a perfect match between the paths for phase, gain and DC offsets. Consequently distortions are present between the I and Q signals resulting in distortion/corruption of information carried by the incoming signal. For example, phase imbalances between, gain imbalances between and DC offsets on the I and Q signals may affect data derived from these signals resulting in errors in the derived data. In order to minimise the effects of the circuit imperfections on the integrity of the recovered information from the incoming signal, a method is required to compensate for circuit imbalances between the paths and the DC offsets.

In the past, these problems were avoided by using stringent specifications on components, and by tuning the paths to minimise imbalances therebetween and DC offsets. This is therefore more prone to degradation, more expensive and so forth.

An approach to I and Q signal regeneration according to the prior art uses a six-port junction based direct receiver (hereafter "6-port receiver"). Using such a receiver and a two-tone calibration technique initially developed for reflectometry applications, an incoming signal is split into three separate signals and a fourth output port provides a signal proportional to the reference signal. These are then used for generation of an I component signal and a Q component signal. The function of such a receiver requires that an incoming signal is split into three versions each phase shifted from the other two versions by 120 degrees. This technique has specific requirements on the incoming signal to perform its calibration and is computationally intensive for real time applications.

OBJECT OF THE INVENTION

The primary object of the invention is to provide a method for regenerating I&Q signals from an incoming signal in the presence of gain imbalances, phase imbalances and DC offsets in regeneration circuitry. The method is applicable to signals either at baseband or at another centre frequency.

Another object of the present invention is to compensate in the receiver for signal distortion due to gain and phase imbalances in the generation circuit at a transmitter.

SUMMARY OF THE INVENTION

In accordance with the invention, there is provided a method of in-phase signal regeneration and quadrature signal regeneration, the method compensating for phase imbalances, gain imbalances and DC offsets, the method comprising the steps of:

receiving a signal;

generating three digitised phase shifted versions of the received signal, the versions phase shifted one from the others by an amount other than 0 and 180 degrees, the digitised phase shifted versions each comprising a plurality of samples;

determining from the samples a mean value for each signal, the mean values for compensating for DC offsets;

determining from the samples a plurality of coefficients for use in mapping the three digitised phase shifted versions of the received signal into dimensions;

projecting data derived from each of the three digitised phase shifted versions onto a two-dimensional signal subspace wherein samples from each digitised phase shifted version are multiplied by a determined coefficient and combined in a linear fashion.

In accordance with another embodiment of the invention, there is provided a method of in-phase signal regeneration and quadrature signal regeneration, the method compensating for phase imbalances, gain imbalances and DC offsets, the method comprising the steps of:

receiving a signal;

generating three digitised phase shifted versions of the received signal, the versions substantially similar to digitised versions obtained by sampling three identical signals phase shifted one from the others by an amount other than 0 and 180 degrees; and, projecting data derived from each of the three digitised phase shifted versions onto a two-dimensional signal subspace wherein data derived from each digitised phase shifted versions affects a resulting signal within each of the two dimensions of the subspace.

In accordance with another embodiment of the invention, there is provided a method of in-phase signal regeneration and quadrature signal regeneration, the method compensating for phase imbalances, gain imbalances and DC offsets, the method comprising the steps of:

receiving a signal;

generating a plurality of digitised phase shifted versions of the received signal, the versions phase shifted one from the others by an amount other than 0 and 180 degrees;

generating a correlation matrix, the correlation matrix dependent upon the plurality of digitised phase shifted versions;

decomposing the correlation matrix to produce in-phase and quadrature regeneration coefficients; and applying the coefficients to the digitised phase shifted versions of the signal to extract in-phase and quadrature components of the received signal therefrom.

In accordance with yet another embodiment of the invention, there is provided a method of in-phase and quadrature signal regeneration for use with one of a quadrature receiver and a quadrature transmitter, the method compensating for phase imbalances, gain imbalances and DC offsets in the one of the quadrature receiver and a quadrature transmitter, the method comprising the steps of:

receiving a signal;

generating a plurality of digitised phase shifted versions of the received signal;

processing the digital versions to determine linear regeneration coefficients; and, applying the determined linear combination coefficients to the digitised phase shifted versions to extract in-phase and quadrature signal components from the received signal.

In an embodiment, processing the digital versions to determine linear regeneration coefficients comprises the steps of:

determining a correlation matrix of the digitised phase shifted versions over a set of samples of a predetermined size;

determining a mean value of each digitised phase shifted version over the set of samples;

determining eigenvalues of the determined correlation matrix;

ranking the determined eigenvalues and selecting two of the eigenvalues;

determining eigenvector components associated with the two selected eigenvalues;

mapping the eigenvector components to regeneration coefficients;

determining the DC offset compensation coefficients using the regeneration coefficients; and, providing the coefficients as the linear combination coefficients.

In an embodiment, applying the determined linear combination coefficients comprises the following steps:

receiving the regeneration coefficients;

multiplying samples from the digitised phase shifted versions with associated regeneration coefficients to produce results and summing the results to produce an estimate of samples of the in-phase and quadrature signal components; and summing the DC compensation coefficients with the estimate of samples of the in-phase and quadrature signal components to produce samples of the in-phase and quadrature signal components.

In accordance with another aspect of the invention, there is provided an in-phase and quadrature signal regeneration circuit for use with one of a quadrature receiver and a quadrature transmitter, the circuit compensating for phase imbalances, gain imbalances and DC offsets in the one of the quadrature receiver and the quadrature transmitter, the circuit comprising:

an analog to digital converter for generating a plurality of digitised phase shifted versions of a signal received by the quadrature receiver;

a processor for processing the digital versions to determine linear regeneration coefficients and for applying the determined linear combination coefficients to the digitised phase shifted versions to extract in-phase and quadrature signal components from the received signal.

BRIEF DESCRIPTION OF THE DRAWINGS

An exemplary embodiment of the invention will now be described in conjunction with the attached drawings, in which.

DETAILED DESCRIPTION OF THE INVENTION

While the invention is described herein for application as a communication receiver, the invention is not limited to that application. The invention is applicable in any field where a quadrature receiver is used. The primary use of this invention emphasised in the description hereinbelow is digital communication receivers and essentially zero-IF digital receivers. An example of another application of the invention is medical imaging.

Figure 1:
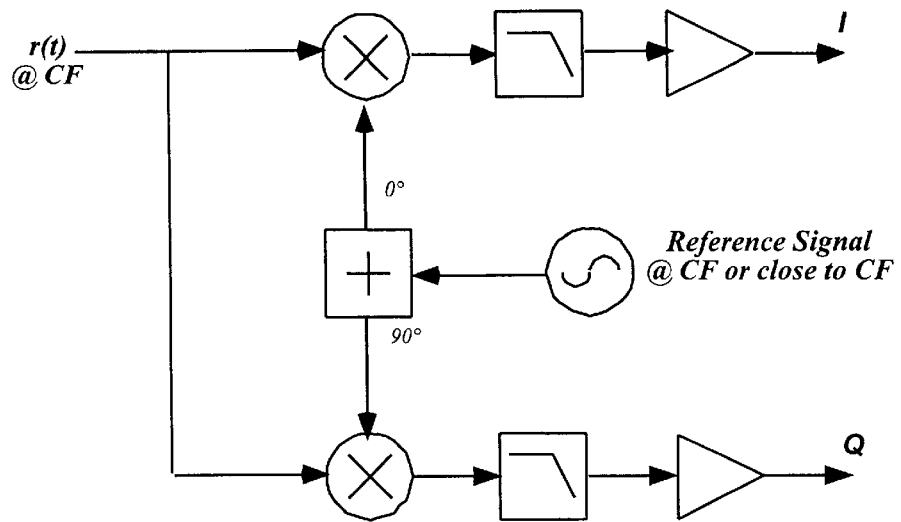
FIG. 1 is a prior art method of generating in-phase and quadrature signal components from an incoming signal.

As described above, a common approach to generating two orthogonal baseband signals from an incoming signal having a centre frequency (CF) comprises mixing the incoming signal with a reference signal tuned to approximately a same CF, as shown in FIG. 1. The in-phase (I) signal results from mixing the incoming signal with the reference signal tuned to approximately a same CF and the quadrature (Q) signal results from mixing the incoming signal with a version of the reference signal phase shifted by 90°. After mixing the signals, a filter is used to remove undesired products of the mixing. Amplification is commonly used to adjust the I and Q signals to suitable levels for further processing.

Figure 2:
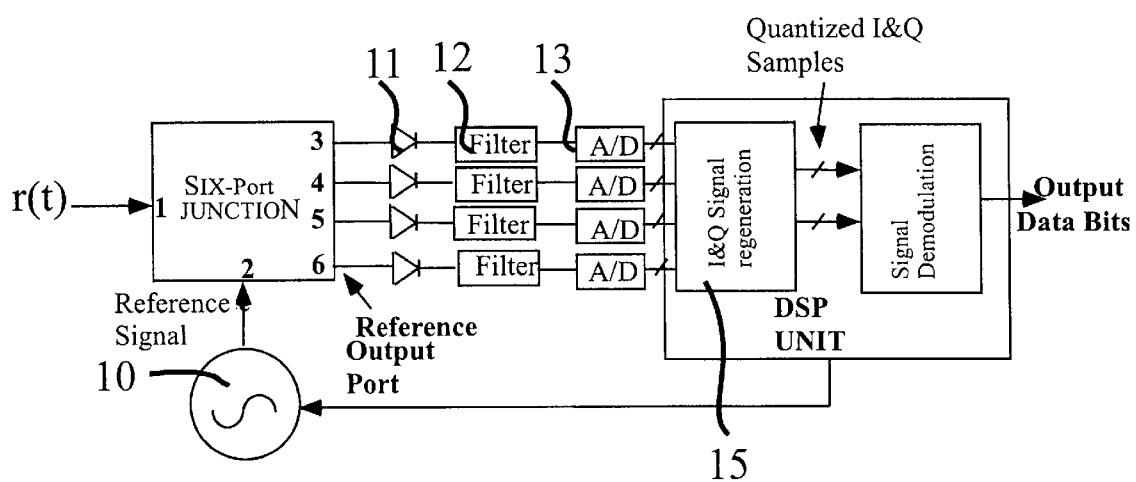
FIG. 2 shows a prior art six-port junction based direct receiver.

The basic structure of a prior art 6-port receiver is described with reference to FIG. 2. An RF modulated input signal of interest (RF signal) is fed to a port 1 of a six-port junction. A reference signal (LO signal), at a frequency close to a centre frequency of the RF signal, is fed to another port 2 of the receiver from a signal generator 10. Signals provided at each of three of the output ports 3, 4, 5 are vector sums of the two input signals with a total phase difference between each of them of 120°. A signal provided at a fourth output port 6 is proportional to the LO signal. These four output signals are fed to square-law diodes 11, power detectors, to produce baseband signals and are then filtered and amplified with filters and amplifiers 12 and sampled to form digital signals using analog to digital converters 13. Optionally, separate filters and amplifiers are used. The filtering is required to prevent anti-aliasing. After digitising the signals, the four digital signals are fed to an I&Q signal regeneration processing unit 15. The regeneration function entails determination of regeneration coefficients from a set of samples and application of these coefficients to incoming samples to produce two baseband signals in quadrature—in-phase and quadrature signals. Then, normal demodulation circuitry is applied.

Figure 3:
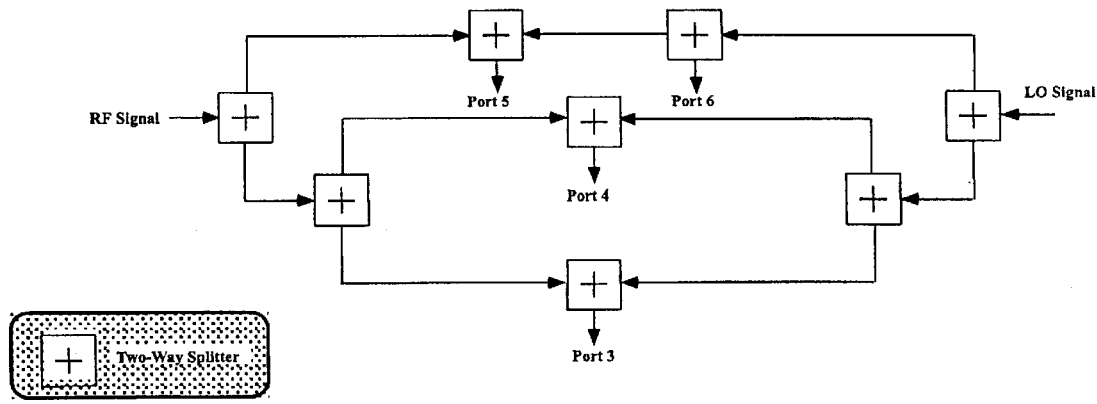
FIG. 3 is a simplified functional block diagram of the six-port junction based direct receiver of FIG. 2 and according to the prior art.

The six-port junction is realised in one of several fashions. FIG. 3 shows a functional block diagram of a six-port junction. Many topologies may be used to implement this functionality. In this example, a phase difference between a vector sum of the RF and LO signals at ports 3,4 and 5 is nominally 120°.

Design constraints include a need for a 120° phase difference, ideally, between the three output ports; minimum attenuation of the RF and LO signal components; and good isolation between the reference output port (Port 6) and the RF signal input port. These constraints are difficult to meet. Commonly, fabrication imperfections introduce errors and the constraints are, thereby, not met. Because the main use of 6-port junction devices is in reflectometer applications as a basic instrument to measure impedance, there is a need to calibrate such a 6-port junction. Several calibration techniques are known.

The present invention addresses the compensation of phase imbalances, gain imbalance and DC offsets in I&Q regeneration circuits. The method and circuit for carrying out the method allow for relaxed specifications for front-end electronic circuitry. One use of the present invention is in a multi-port junction based direct receiver for communication applications having 4 or more ports.

Figure 4:
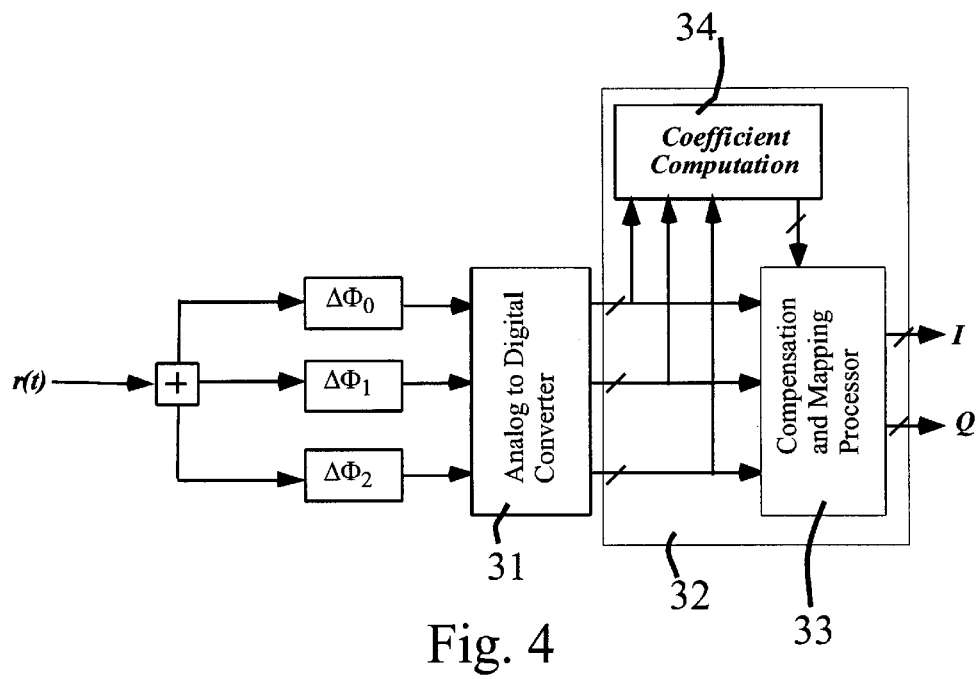
FIG. 4 is a simplified functional block diagram of a regeneration processor according to the invention.

Referring to FIG. 4, there is shown a basic element to regenerate in-phase and quadrature signal components of an incoming signal. First, the incoming signal is split into three paths $\Delta\phi_0$, $\Delta\phi_1$, and $\Delta\phi_2$, each path resulting in a different phase shift of the incoming signal r(t). The amount of phase shift between each phase-shifted signal must be different than 0° and 180° and, optimally, is approximately 120° for the three signal paths. The phase-shifted signals are digitised using an analog to digital converter 31 and samples of each are provided to a processor 32. The samples are used to determine regeneration coefficients. Once these coefficients are determined, they are passed to a regeneration circuit 33 where the coefficients are applied to samples of the phase shifted versions of the signal r(t) in order to extract I&Q signal components therefrom. Optionally, the regeneration coefficients are updated regularly to compensate for changes due to time or temperature induced variations. In some cases, updating of the regeneration coefficients is unnecessary; when unnecessary, determining the regeneration coefficients is performed once during the initial setup of the receiver.

The processor 32 determines the regeneration coefficients using an eigen-decomposition method. The samples of the three signals $\Delta\phi_0$, $\Delta\phi_1$, and $\Delta\phi_2$ provided by the analog to digital converter (A/D) 31 are designated $x_i(n)$'s (i=1,2,3), at time $nT_S$ where $T_S$ is the sampling period. The processor 32 operates on M sets of signal samples in performing the determination of the regeneration coefficients. There are constraints on correlation between samples. For example, for a signal corrupted by additive white Gaussian noise (AWGN), the sets of samples are sometimes contiguous in time; however, when the process corrupting the samples has memory, the samples should preferably be more spaced in time. The number M of sets of samples is not extremely large. Under low signal-to-noise ratio (SNR) (typically 4 dB) for a signal corrupted by AWGN, it was found in experiments that a value of M of approximately 10,000 was sufficient. For a SNR of 8–9 dB, a value of M around 1,000 was used. Because, according to the invention, calculations are performed recursively, the number of sets of samples has little impact on hardware requirements for the processor 32; however, in some instances it does impact processing delay of the system. In some applications, a trade-off between performance and processing delay is evaluated to determine an optimum implementation.

The recursive computation of the correlation matrix $R_D(n)$ is performed according to the following equation:

$$R_D(n) = \frac{n-1}{n} R_D(n-1) + \frac{1}{n} \begin{pmatrix} x_1(n) \\ x_2(n) \\ x_3(n) \end{pmatrix} (x_1(n) \; x_2(n) \; x_3(n))$$

with the initial value:

$$R_D(1) = \begin{pmatrix} x_1(1) \\ x_2(1) \\ x_3(1) \end{pmatrix} (x_1(1) x_2(1) x_3(1))$$

The mean values are computed recursively as follows:

$$m_i(n) = \frac{n-1}{n} m_i(n-1) + \frac{1}{n} x_i(n) \quad i = 1, 2, 3$$

with $$m_i(1) = x_i(1)$$

After having gathered M sets of samples, eigenvalues of $R_D(M)$ are determined as follows:

$$\lambda_1 = 2 \cdot \sqrt[3]{\rho} \cos(\theta) - \frac{c_1}{3}$$

$$\lambda_2 = 2 \cdot \sqrt[3]{\rho} \cos(\theta + 120) - \frac{c_1}{3}$$

$$\lambda_3 = 2 \cdot \sqrt[3]{\rho} \cos(\theta + 240) - \frac{c_1}{3}$$

where $$\rho = \sqrt{-\left(\frac{p}{3}\right)^3} \; ; \; \theta = \frac{1}{3} \cos^{-1}\left(-\frac{q}{2\rho}\right)$$

$$p = \frac{-c_1^2}{3} + c_2; \; q = \frac{2}{27} c_1^3 - \frac{1}{3} c_1 c_2 + c_3$$

$c_1 = -(r_{11} + r_{22} + r_{33})$
$c_2 = (r_{11}r_{22} + r_{11}r_{33} + r_{22}r_{33}) - (r_{23}^2 + r_{12}^2 + r_{13}^2)$
$c_3 = -(r_{11}r_{22}r_{33} + r_{12}r_{23}r_{31} + r_{13}r_{32}r_{21}) + (r_{11}r_{23}^2 30 \; r_{22}r_{13}^2 + r_{33}r_{12}^2)$ and $r_{ij}$ is an element of $R_D(M)$ in an $i^{th}$ row and a $j^{th}$ column.

Eigenvalues are ranked such that:

$$\lambda_1^* < \lambda_2^* < \lambda_3^*$$

When DC components in the three signals fed to the analog to digital converter are not present and/or have been removed, then eigenvectors associated with the two largest eigenvalues are determined. Otherwise, eigenvectors associated with the two smallest eigenvalues are determined. Denoting an eigenvector associated with an eigenvalue $\lambda_j^*$ as $v_j = (v_{j1}, v_{j2}, v_{j3})$, for j=1,2; the following relations result:

$$v_{1j} = \frac{1}{\sqrt{1 + z_{2j}^2 + z_{3j}^2}}$$

$$v_{2j} = \frac{z_{2j}}{\sqrt{1 + z_{2j}^2 + z_{3j}^2}}$$

$$v_{3j} = \frac{z_{3j}}{\sqrt{1 + z_{2j}^2 + z_{3j}^2}}$$

where $$z_{2j} = \frac{1}{r_{12}}\left\{-(r_{11} - \lambda_j^*) - \frac{r_{13}((r_{11} - \lambda_j^*)(r_{22} - \lambda_j^*) - r_{12}^2)}{r_{12}r_{23} - r_{13}(r_{22} - \lambda_j^*)}\right\}$$

$$z_{3j} = \frac{(r_{11} - \lambda_j^*)(r_{22} - \lambda_j^*) - r_{12}^2}{r_{12}r_{23} - r_{13}(r_{22} - \lambda_j^*)}$$

$a_i$'s and $b_i$'s (i=1,2,3) are mapped to $v_{ji}$'s as follows:

$a_1 = v_{11}$; $a_2 = v_{21}$; $a_3 = v_{31}$ $b_1 = v_{12}$; $b_2 = v_{22}$; $b_3 = v_{32}$

The remaining two coefficients are determined as follows:

$$a_0 = -\sum_{i=1}^{N} a_i m_i(M)$$

$$b_0 = -\sum_{i=1}^{N} b_i m_i(M)$$

where N is the number of phase shifted versions of the received signal. N=3 for a five-port junction receiver as described herein.

Using the determined linear combination coefficients, samples of the I and Q signals are generated using the following relations:

$$I(n) = a_0 + \sum_{i=1}^{N} a_i x_i(n)$$

$$Q(n) = b_0 + \sum_{i=1}^{N} b_i x_i(n)$$

These coefficients are updated on a continuous basis or established once during initial setup of the receiver. In the latter case, initial gain, phase, and DC offset characteristics of the front end receiver circuit are maintained. Any fluctuations in gain imbalances, phase imbalances and DC offsets occurring after the coefficient calculations are reflected in the regenerated I and Q signal samples and, where generated, in the regenerated I and Q signals because of a linear relationship between the three input signals and the I and Q output signals.

Preferably, when the coefficients are updated periodically, a smooth transition occurs from one set of coefficients to a next set of coefficients in order to prevent large phase, gain and DC offset discontinuities in resulting I and Q signals. Although there are many ways a transition is smoothed, a simple linear interpolation between a current set of coefficients and a new set of coefficients performed over a few tens of sample periods is often acceptable.

More sophisticated methods of transition smoothing is used to minimise spurious results from application of the method of the invention when required. For example, a least-mean square adaptive algorithm is used to indirectly perform eigen decomposition and to derive two projection vectors that project a vector of samples of multiple phase shifted signal versions onto a two-dimensional signal subspace comprising a subspace for an in-phase signal component and a subspace for a quadrature signal component. This procedure updates the coefficients continuously. The procedure has an inherent coherency since the coefficients are derived from the previous values by adding a small correction attributed to the new measurements. This inherent coherency eliminates phase, gain and DC offset discontinuities.

Figure 5:
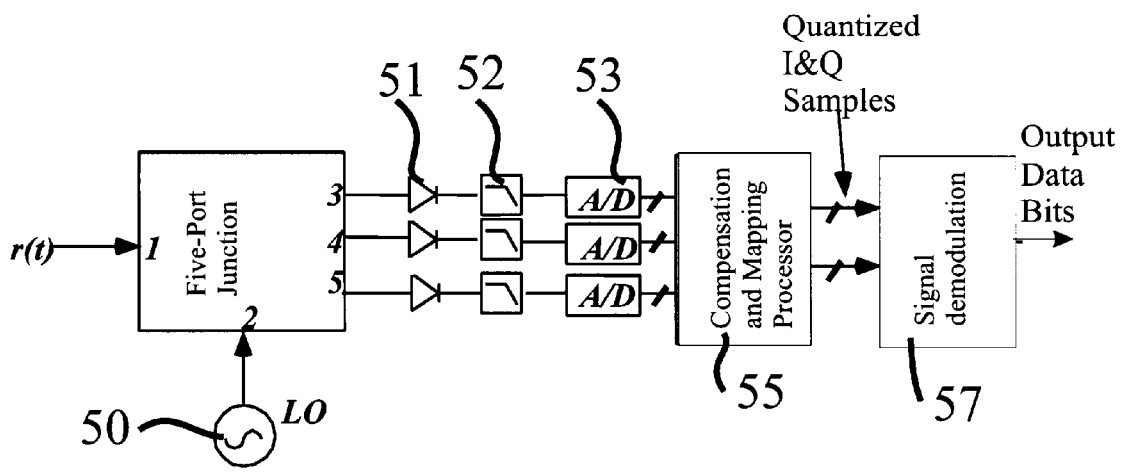
FIG. 5 is a functional block diagram of a receiver using the method according to the invention.

An embodiment is shown in FIG. 5 for 5 ports. A signal generator 50 provides a reference signal at a centre frequency of an incoming signal r(t) to a port 2 of the receiver. The incoming signal r(t) is provided to a port 1 of the receiver. Three signals are provided one at each of three output ports 3, 4, and 5. The signals are shifted in phase relative to each other. Of course, this requires shifting at least two of the signals in phase. Since samples of the phase shifted signals are desired, shifting of phase for the sampled signals may occur before, during, or after sampling.

These output signals are fed to power detectors 51, resulting in a zero-IF or near zero-IF replica of the signal r(t). Output signals from the detectors are amplified and filtered at amplifiers and filters 52 and provided to an analog-to-digital (A/D) converter 53, which samples the signals to generate digital versions of the three, filtered and amplified signals. The digital samples are then linearly combined in a processor 55 resulting in samples representative of the in-phase and quadrature signal components of the incoming signal r(t). I and Q signal sample regeneration comprises a step of combining the samples resulting from the analog to digital conversion in a linear fashion in order to determine quantised samples of the I and Q signal components for use by the demodulator 57 to determine output data bits. The linear combination coefficients are determined by the processor 55 based on sets of digital signal samples gathered at least once, and potentially periodically. Eight coefficients are determined for use in the I and Q signal regeneration circuit. According to the invention, coefficients are determined for compensating for phase imbalances, gain imbalances and DC offsets in the three output signals provided from the five-port junction based direct receiver.

In-phase and quadrature signal components of an incoming signal are determined by a linear combination of three phase shifted versions of the received signal. The combination is according to the following formulae:

$$I = a_0 + \sum_{i=1}^{N} a_i x_i$$

$$Q = b_0 + \sum_{i=1}^{N} b_i x_i$$

where the $x_i$'s (i=1,2,3; for N=3) are samples of phase shifted versions of the incoming signal, $a_0$ and $b_0$ provide compensation for DC offsets, and $a_i$'s and $b_i$'s (i=1,2,3 for N=3,) compensate for the phase and gain imbalances. The description herein, except when stated otherwise, relates to a five-port junction based receiver and therefore N is 3 in the equations above.

Linear combination coefficients, $a_i$ and $b_i$, are calculated from samples of the incoming signal. M sets of samples ($x_i(n)$, i=1,2,3, n=1,2, . . . , M) are gathered to calculate the linear combination coefficients ($a_i$, $b_i$, i=0,1,2,3). The M sets of samples are used to calculate a correlation matrix $R_D$ either recursively or directly. A mean of each signal $x_i$ ($m_i$, i=1,2,3) is calculated and eigenvalues ($\lambda_i$, i=1,2,3) of $R_D$ are computed. The eigenvectors associated with the two smallest eigenvalues are then computed, normalised and scaled. The elements of these two eigenvectors correspond to $a_i$'s and $b_i$'s (i=1,2,3) for use in regenerating the I&Q signals. The DC offset compensation coefficients are then determined using the following equations:

$$a_0 = -\sum_{i=1}^{N} a_i m_i$$

$$b_0 = -\sum_{i=1}^{N} b_i m_i$$

Figure 6:
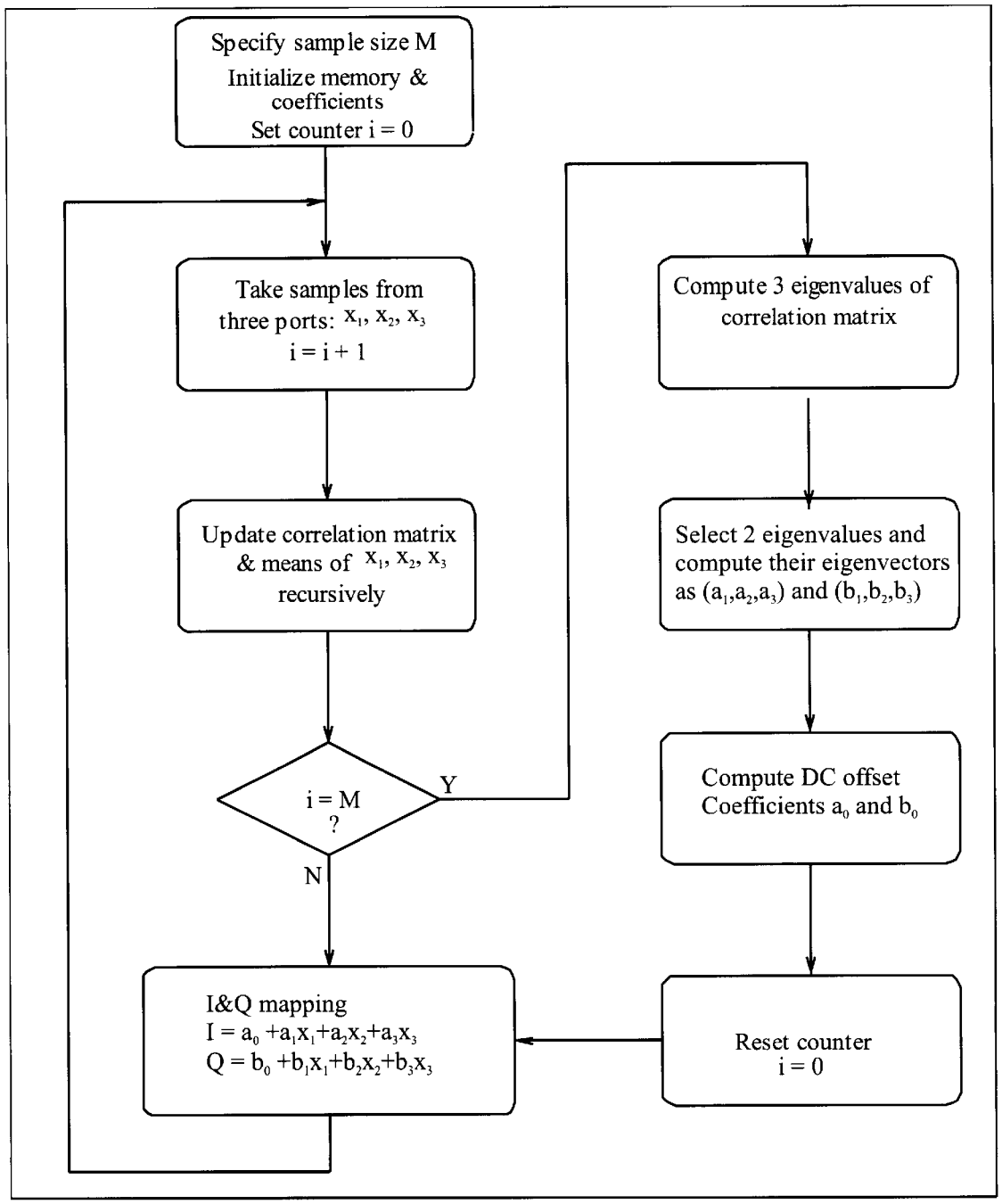
FIG. 6 is a simplified flow diagram of a method according to the invention applied to a 5-port junction based direct receiver such as that shown in FIG. 5 where three phase shifted versions of the incoming signal are provided by the junction device.

FIG. 6 shows a simplified flow diagram of calculation steps for calculating the regeneration coefficients. Often, it is sufficient to perform the calculations with twice as much accuracy as that of the sampling analog to digital converter; for example, when using 8 bit samples, it is preferable to use 16-bit accuracy in calculations. In a first step, sample size is specified, memory is initialised, and parameters are set, when necessary. This initialises the system for coefficient generation.

Then samples are gathered from each of the phase shifted signals. Of course, shifting of phase for the sampled signals is performed in any of numerous fashions. For example, the signal is split into three identical copies, which are phase shifted differently and then sampled. Alternatively, sampling is performed on a single signal at intervals, which result in three or more sampled signals each having a phase offset from the other sampled signals.

The samples are then used to update the correlation matrix and the mean of each of the three or more signals. When the number of samples is M, the number for generation of new coefficients, then the eigenvalues are determined and an eigenvector is formed as described above. DC offsets $a_0$ and $b_0$ are computed and the sample counter is reset. Then the I and Q signal sample regeneration is performed according to the above noted equations. When the number of samples is less than M, the I and Q signal sample regeneration is performed according to the above noted equations and the sample counter is incremented.

Figure 7:
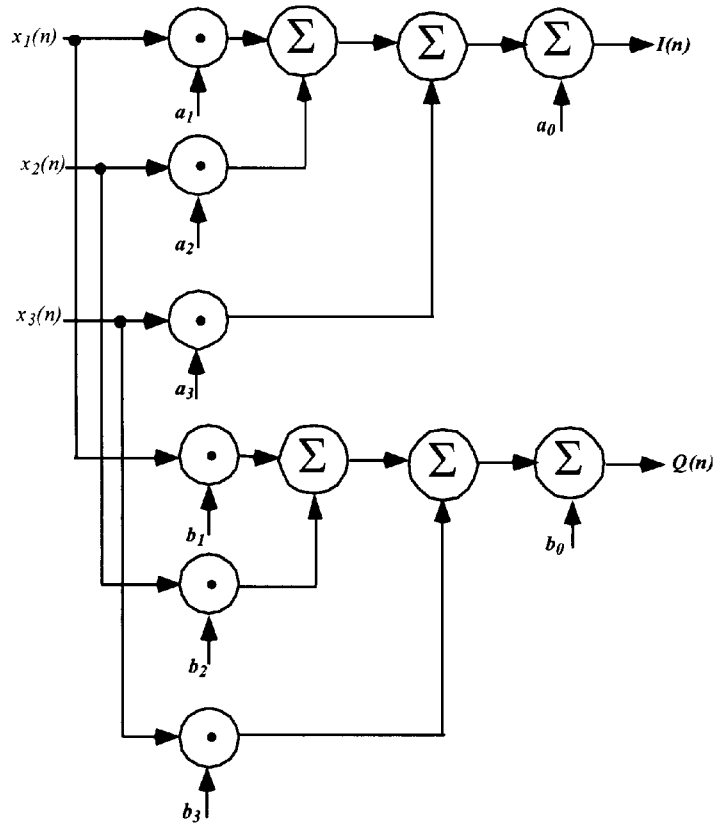
FIG. 7 shows a functional block diagram of the processing performed by the regeneration processor; and, FIG. 8 shows an application of the invention to a four-port junction based direct receiver where only two signals are used by a regeneration circuit.

FIG. 7 shows a functional block diagram of I and Q signal sample regeneration once the coefficients are known. The processing is easily implemented using digital hardware. Alternatively, an analog processor is used.

Preferably, there are 3 phase shifted versions of the received signal as are provided, for example, by a five-port junction. Though receivers with more than 5 ports function correctly, analysis shows little or no improvement in the resulting in-phase and quadrature signals using a receiver with more than 5 ports over receivers having 5 ports. Further, under certain conditions, acceptable performance is obtained with two phase shifted versions of the received signal as are obtained, for example, using a four-port junction. When the frequency conversion is made using detector diodes as in the junction based receiver shown, amplitude modulation present on a desired signal and on any adjacent signals is folded into the desired signal band. According to the present invention where a receiver has more than 4 ports, removal of amplitude modulation noise results. When there is no amplitude modulation on the desired and adjacent signals, the regeneration method requires only two baseband phase shifted versions of the received signal without loss of performance. Therefore a receiver with 4 ports functions adequately for some applications.

Figure 8:
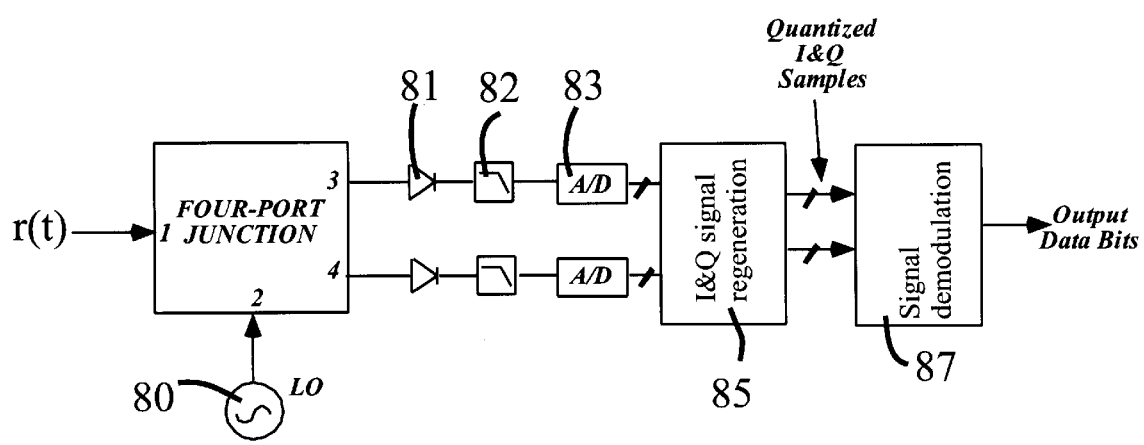

The use of at least three phase shifted versions of the received signal is required when the received or any adjacent signals have amplitude modulation, and this modulation is not desired—the signals are brought to baseband using a direct receiver approach. The new method based on three phase shifted versions of the received signal allows the removal of the amplitude modulation noise introduced within the signal band. When there is no amplitude modulation noise or when it is considered negligible, use of two phase shifted versions of the received signal according to the invention is useful. Using a 4-port junction based direct receiver, hardware and processing are simplified as illustrated in FIG. 8.

Here, only two output signals, $x_1(n)$ and $x_2(n)$, are provided by the receiver at ports 3 and 4. For a given sample set size M, a correlation matrix is determined recursively as follows:

$$R_D(n) = \frac{n-1}{n} R_D(n-1) + \frac{1}{n}\begin{pmatrix} x_1(n) \\ x_2(n) \end{pmatrix}(x_1(n) \;\; x_2(n))$$

with an initial value:

$$R_D(1) = \begin{pmatrix} x_1(1) \\ x_2(1) \end{pmatrix}(x_1(1) \;\; x_2(1))$$

Then a DC offset for each signal, the mean value of the samples, is computed using:

$$m_i(n) = \frac{n-1}{n} m_i(n-1) + \frac{1}{n} x_i(n), \;\; i = 1, 2$$

with an initial value $$m_i(1) = x_i(1), \; i=1,2$$

After gathering M sets of samples, the correlation matrix $$R_D(M) = \begin{pmatrix} r_{11} & r_{12} \\ r_{21} & r_{22} \end{pmatrix}$$

is determined and two eigenvalues $$\lambda_1 = \frac{r_{11} + r_{22} + \sqrt{(r_{11} - r_{22})^2 + 4 r_{12} r_{21}}}{2}$$

$$\lambda_2 = \frac{r_{11} + r_{22} - \sqrt{(r_{11} - r_{22})^2 + 4 r_{12} r_{21}}}{2}$$

are determined. Then the coefficients are computed using the following equations:

$$a_1 = \frac{|r_{12}|}{\sqrt{r_{12}^2 + (\lambda_1 - r_{11})^2}}$$

$$a_2 = \frac{\lambda_1 - r_{11}}{\sqrt{r_{12}^2 + (\lambda_1 - r_{11})^2}}$$

$$b_1 = \frac{|r_{12}|}{\sqrt{r_{12}^2 + (\lambda_2 - r_{11})^2}}$$

-continued $$b_2 = \frac{\lambda_2 - r_{11}}{\sqrt{r_{12}^2 + (\lambda_2 - r_{11})^2}}$$

where $|\cdot|$ denotes absolute value. The DC offset coefficients are determined as follows:

$$a_0 = -[a_1 m_1(M) + a_2 m_2(M)]$$

$$b_0 = -[b_1 m_1(M) + b_2 m_2(M)]$$

which is in accordance with the above equation. The regenerated signals are determined using a specific form of the above noted general equations:

$$I(n) = a_0 + a_1 x_1(n) + a_2 x_2(n)$$

$$Q(n) = b_0 + b_1 x_1(n) + b_2 x_2(n)$$

Thus, though amplitude modulation noise is not removed, the method is applicable using a four-port junction based direct receiver. Of course, where amplitude modulation noise exists, an implementation using three or more phase shifted versions of the received signal is preferred.

Numerous other embodiments are envisioned without departing from the spirit or scope of the invention.

What is claimed is:

1. A method of in-phase signal regeneration and quadrature signal regeneration, the method compensating for phase imbalances, gain imbalances and DC offsets, the method comprising the steps of:

receiving a signal;

generating three digitised phase shifted versions of the received signal, the versions phase shifted one from the others by an amount other than 0 and 180 degrees, the digitised phase shifted versions each comprising a plurality of samples;

determining from the samples a mean value for each signal, the mean values for compensating for DC offsets;

determining from the samples a plurality of coefficients for use in mapping the three digitised phase shifted versions of the received signal into at least two dimensions;

projecting data derived from each of the three digitised phase shifted versions onto a signal subspace having at least two dimensions wherein samples from each digitised phase shifted version are multiplied by a determined coefficient and combined in a linear fashion and wherein the signal subspace comprises a subspace for an in-phase signal component and a subspace for a quadrature signal component.

2. The method of claim 1 wherein the step of determining coefficients comprises eigen decomposition of a correlation matrix related to the incoming signal.

3. The method of claim 1 comprising the step of generating an in-phase and a quadrature signal from the transformed vector data using a digital to analog converter.

4. A method of in-phase signal regeneration and quadrature signal regeneration, the method compensating for phase imbalances, gain imbalances and DC offsets, the method comprising the steps of:

receiving a signal;

generating three digitised phase shifted versions of the received signal, the versions substantially similar to digitised versions obtained by sampling three identical signals phase shifted one from the others by an amount other than 0 and 180 degrees; and, projecting data derived from each of the three digitised phase shifted versions onto a signal subspace having at least two dimensions wherein data derived from each digitised phase shifted version affects a resulting signal within each of the at least two dimensions of the subspace and wherein the signal subspace comprises a subspace for an in-phase signal component and a subspace for a quadrature signal component;

wherein the three versions are baseband versions of the received signal, the versions substantially similar to digitised baseband versions obtained by sampling three identical baseband signals phase shifted one from the others by an amount other than 0 and 180 degrees.

5. A method of in-phase signal regeneration and quadrature signal regeneration, the method compensating for phase imbalances, gain imbalances and DC offsets, the method comprising the steps of:

receiving a signal;

generating three digitised phase shifted versions of the received signal, the versions substantially similar to digitised versions obtained by sampling three identical signals phase shifted one from the others by an amount other than 0 and 180 degrees; and, projecting data derived from each of the three digitised phase shifted versions onto a signal subspace having at least two dimensions wherein data derived from each digitised phase shifted version affects a resulting signal within each of the at least two dimensions of the subspace and wherein the signal subspace comprises a subspace for an in-phase signal component and a subspace for a quadrature signal component;

wherein the data derived from each of the three signals is assembled into a vector comprising a sample from each digitised phase shifted version and wherein the step of projecting comprises the step of transforming the vector.

6. The method of claim 5 comprising the step of generating an in-phase and a quadrature signal from the transformed vector data using a digital to analog converter.

7. A method of in-phase signal regeneration and quadrature signal regeneration, the method compensating for phase imbalances, gain imbalances, the method comprising the steps of:

receiving a signal;

generating a plurality of digitised phase shifted versions each comprising a plurality of samples of the received signal, the versions phase shifted one from the others by an amount other than 0 and 180 degrees;

determining from the samples a plurality of coefficients for use in mapping the plurality of digitised phase shifted versions of the received signal by the steps of:

generating a correlation matrix, the correlation matrix dependent upon the plurality of digitised phase shifted versions;

decomposing the correlation matrix to produce in-phase and quadrature regeneration coefficients; and applying the coefficients to the digitised phase shifted versions of the signal to extract in-phase and quadrature components of the received signal therefrom.

8. The method of claim 7 wherein the step of decomposing the matrix is performed using eigen decomposition.

9. A method of in-phase and quadrature signal regeneration for use with a quadrature receiver comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components compensated for phase imbalances and gain imbalances in a quadrature transmitter from the received signal.

10. A method of in-phase and quadrature signal regeneration for use with a quadrature receiver, the method compensating for phase imbalances and gain imbalances in one of the quadrature receiver and a quadrature transmitter, the method comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components from the received signal, wherein the step of processing the digital versions to determine linear regeneration coefficients therefrom is performed in the absence of a further set of samples relating to a reference signal.

11. A method of in-phase and quadrature signal regeneration for use with a quadrature receiver, the method compensating for phase imbalances and gain imbalances in one of the quadrature receiver and a quadrature transmitter, the method comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components from the received signal, wherein the step of generating a plurality of digitised phase shifted versions of the received signal is performed, where the plurality is N, by mixing the received signal with a reference signal to produce a baseband signal and sampling the baseband signal at a sampling rate of N times a sampling rate for single sampled signal, and where each Nth sample is a sample of a same digitised phase shifted version.

12. A method of in-phase and quadrature signal regeneration for use with a quadrature receiver, the method compensating for phase imbalances and gain imbalances in one of the quadrature receiver and a quadrature transmitter, the method comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components from the received signal, wherein the step of determining linear regeneration coefficients is performed iteratively.

13. A method of in-phase and quadrature signal regeneration for use with a quadrature receiver, the method compensating for phase imbalances and gain imbalances in one of the quadrature receiver and a quadrature transmitter, the method comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components from the received signal, wherein the step of processing the digital versions to determine linear regeneration coefficients comprises the steps of:

determining a correlation matrix of the digitised phase shifted versions over a set of samples of a predetermined size;

determining a mean value of each digitised phase shifted version over the set of samples;

determining eigenvalues of the determined correlation matrix;

ranking the determined eigenvalues and selecting two of the eigenvalues;

determining eigenvector components associated with the two selected eigenvalues;

mapping the eigenvector components to regeneration coefficients;

determining the DC offset compensation coefficients using the regeneration coefficients; and, providing the coefficients as the linear combination coefficients.

14. A method as defined in claim 13 wherein the two smallest eigenvalues are selected in the presence of a substantial DC component.

15. A method as defined in claim 13 wherein the two largest eigenvalues are selected when the DC component is negligible.

16. A method as defined in claim 13, wherein the step of processing the digital versions to determine linear regeneration coefficients comprises the steps of:

determining a correlation matrix of the digitised phase shifted versions over a set of samples of a predetermined size;

determining a mean value of each digitised phase shifted version over the set of samples;

determining eigenvalues of the determined correlation matrix;

ranking the determined eigenvalues and selecting two of the eigenvalues;

determining eigenvector components associated with the two selected eigenvalues;

mapping the eigenvector components to regeneration coefficients;

determining the DC offset compensation coefficients using the regeneration coefficients; and, providing the coefficients as the linear combination coefficients; and wherein the step of applying the determined linear combination coefficients comprises the following steps:

receiving the regeneration coefficients;

multiplying samples from the digitised phase shifted versions with associated regeneration coefficients to produce results and summing the results to produce an estimate of samples of the in-phase and quadrature signal components; and summing the DC compensation coefficients with the estimate of samples of the in-phase and quadrature signal components to produce samples of the in-phase and quadrature signal components.

17. A method of in-phase and quadrature signal regeneration for use with a quadrature receiver, the method compensating for phase imbalances and gain imbalances in one of the quadrature receiver and a quadrature transmitter, the method comprising the steps of:

receiving a signal;

generating a plurality of digitised phase shifted versions each comprising a plurality of samples of the received signal;

determining from the samples a plurality of coefficients for use in mapping the plurality of digitised phase shifted versions of the received signal by the step of:

processing the digital versions to determine linear regeneration coefficients therefrom; and, applying the determined linear regeneration coefficients to the digitised phase shifted versions to extract in-phase and quadrature signal components from the received signal, wherein the step of applying the determined linear combination coefficients comprises the following steps:

receiving the regeneration coefficients;

multiplying samples from the digitised phase shifted versions with associated regeneration coefficients to produce results and summing the results to produce an estimate of samples of the in-phase and quadrature signal components; and summing the DC compensation coefficients with the estimate of samples of the in-phase and quadrature signal components to produce samples of the in-phase and quadrature signal components.

18. An in-phase and quadrature signal regeneration circuit for use with a quadrature receiver, the circuit comprising:

at least an analog to digital converter for generating a plurality of digitised phase shifted versions of a signal received by the quadrature receiver;

a processor for processing the digital versions for determining a plurality of coefficients by the step of: determining linear regeneration coefficients and for applying the determined linear regeneration coefficients to the digitised phase shifted versions to extract in-phase and quadrature signal components compensated for phase imbalances and gain imbalances in the quadrature transmitter from the received signal.

19. A circuit as defined in claim 18 comprising a five-port junction for receiving a signal received by the quadrature receiver, for receiving a reference signal and for providing three baseband signals relating to the received signals, each baseband signal shifted in phase from the others.

20. A circuit as defined in claim 18, wherein the processor comprises means for performing the steps of:

determining a correlation matrix of the digitised phase shifted versions over a set of samples of a predetermined size;

determining a mean value of each digitised phase shifted version over the set of samples;

determining eigenvalues of the determined correlation matrix;

ranking the determined eigenvalues and selecting two of the eigenvalues;

determining eigenvector components associated with the two selected eigenvalues;

mapping the eigenvector components to regeneration coefficients;

determining the DC offset compensation coefficients using the regeneration coefficients; and, providing the coefficients as the linear combination coefficients.

21. A method of in-phase signal regeneration and quadrature signal regeneration, the method compensating for phase imbalances, gain imbalances and DC offsets, the method comprising the steps of:

receiving a signal;

generating a plurality of digitised phase shifted versions of the received signal, the versions phase shifted one from the others by an amount other than 0 and 180 degrees, the digitised phase shifted versions each comprising a plurality of samples;

determining from the samples of the digitised phase shifted versions a plurality of eigenvalues and eigenvectors; and, generating an in-phase and a quadrature signal based on the samples of the three digitised phase shifted versions of the received signal and the eigenvalues and eigenvectors.

22. A method as defined in claim 21, comprising the step of performing indirectly eigen decomposition.

23. A method as defined in claim 22, wherein the eigen decomposition is performed using a least mean square adaptive algorithm.

24. A method as defined in claim 21, comprising the steps of:

determining projection vectors based on the eigen values; and, projecting a vector of the samples the digitised phase shifted versions using the projection vectors onto an at least two dimensional subspace comprising a subspace for an in-phase signal component and a subspace for a quadrature signal component.

25. A method as defined in claim 21, comprising the steps of:

determining in-phase and quadrature regeneration coefficients using the eigenvalues; and, applying the coefficients to the digitised phase shifted versions of the received signal to determine in-phase and quadrature signal components.

* * * * *